United States Patent [19]

Kobayashi

[11] Patent Number: 4,641,052
[45] Date of Patent: Feb. 3, 1987

[54] INPUT CIRCUIT FOR A STACKED TYPE PIEZO-ELECTRIC ELEMENT DEVICE

[75] Inventor: Noboru Kobayashi, Yokohama, Japan

[73] Assignee: Kabushiki Kaisha Toshiba, Kawasaki, Japan

[21] Appl. No.: 733,913

[22] Filed: May 14, 1985

[30] Foreign Application Priority Data

Nov. 1, 1984 [JP] Japan ................................ 59-229016

[51] Int. Cl.[4] .......................................... H01L 41/08
[52] U.S. Cl. .................................... 310/317; 310/328
[58] Field of Search ............... 310/328, 314, 316, 315, 310/317, 318, 319

[56] References Cited

U.S. PATENT DOCUMENTS

| | | | |
|---|---|---|---|
| 2,440,709 | 5/1948 | Young | 310/344 X |
| 4,219,755 | 8/1980 | O'Neill et al. | 310/348 |
| 4,384,230 | 5/1983 | Wisner | 310/317 |
| 4,510,412 | 4/1985 | Suda | 310/328 X |

Primary Examiner—Mark O. Budd
Attorney, Agent, or Firm—Schwartz, Jeffery, Schwaab, Mack, Blumenthal & Evans

[57] ABSTRACT

A stacked type piezo-electric element device in accordance with the present invention includes stacked type piezo-electric elements constructed by stacking a plurality of piezo-electric elements with electrodes on both sides, a plurality of voltage impression circuits prepared corresponding to respective piezo-electric elements for supplying a voltage to each electrode of the piezo-electric elements, a power source which connects the voltage impression circuits in parallel, and circuit breaker elements which, when the current that flows in at least one of the voltage impression circuits exceeds a predetermined value, interrupt the current flowing in the voltage impression circuit that exceeds the predetermined value.

5 Claims, 9 Drawing Figures

INPUT CIRCUIT FOR A STACKED TYPE PIEZO-ELECTRIC ELEMENT DEVICE

BACKGROUND OF THE INVENTION

1. Field of Invention

The present invention relates to a stacked type piezo-electric element device formed by stacking a plurality of piezo-electric elements that transform the electric energy to the mechanical energy, more particularly to a stacked type piezo-electric element device and its method of use, whose function as a device as a whole will not be affected even when a part of the elements suffers a dielectric breakdown or the like.

2. Description of the Prior Art

A stacked type piezo-electric element device in which the piezo-electric elements are stacked in a plurality of stages in order to obtain a high density and large displacement has been known in the past. The device is being applied to a variety of fields such as the mechanisms that require a high degree of precision, as an actuator due to electrical to mechanical energy conversion.

One type of stacked device piezo-electric element device is a parallel type bimorph device in which a plurality of piezo-electric elements sandwiched by the electrodes are stacked, and each of the electrodes are connected in parallel to a power source. A stacked type piezo-electric element is used ordinarily with the thickness of each of the piezo-electric element chosen as small as possible in order to obtain a large displacement, and with a relatively high voltage which is applied to the piezo-electric element because of the fact that the displacement of the piezo-electric element is proportional to the intensity of the electric field. However, this means that a dielectric breakdown of the piezo-electric elements themselves or a discharge between the electrodes of the piezo-electric elements will easily to take place.

In a prior art stacked type piezo-electric element device of this kind, when, for example, one of the plurality of piezo-electric elements suffers a dielectric breakdown, the short-circuit current passes along the power circuit which is connected to one side of the power source, a first voltage impression circuit which is connected to the power circuit, an electrode of the piezo-electric element which is connected to the first voltage impression circuit, and from this electrode, via a piezo-electric element, to the other power circuit through the other voltage impression circuit. Because of this, the power source fails to supply a predetermined output voltage, which results in a loss of the displacing function of all of the stacked piezo-electric elements. Namely, even when only a portion of the stacked elements finds itself in a short-circuited state due to dielectric breakdown or the like, it will lead to a problem that the entire function of the stacked type elements as an actuator will be lost.

SUMMARY OF THE INVENTION

An object of the present invention is to provide a stacked type piezo-electric element device which as a whole will not be affected even when a portion of the piezo-electric elements is short-circuited state due to dielectric breakdown or the like.

Another object of the present invention is to provide a stacked type piezo-electric element device, and its method of use, which will permit operation as an actuator with the remaining stacked elements, even when a portion of the piezo-electric elements is short-circuited due to dielectric breakdown or the like.

Briefly described, these and other objects of the present invention are accomplished by the provision of an improved stacked type piezo-electric element device which includes stacked type piezo-electric elements composed by stacking a plurality of piezo-electric elements which have electrodes on both sides of the respective element, a plurality of voltage impression circuits that are arranged for each piezo-electric element for impressing a voltage to each of the electrodes of the piezo-electric element, power circuits which connect the voltage impression circuits in parallel, and circuit breaker elements which, when a current that flows in at least one of the voltage impression circuits, among the entire voltage impression circuits, exceeds a predetermined value, cuts off the current flowing in that voltage impression circuit while permitting normal operation of the remaining voltage impression circuits and corresponding piezo-electric elements.

BRIEF DESCRIPTION OF DRAWING

These and other objects, features and advantages of the present invention will be more apparent from the following description of a preferred embodiment, taken in connection with the accompanying drawing, in which.

DESCRIPTION OF THE PREFERRED EMBODIMENT

Figure 1:
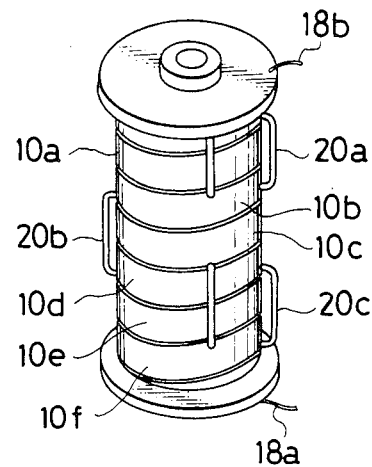
FIG. 1 is an overall perspective view of a prior art stacked type piezo-electric element device.
Figure 2:
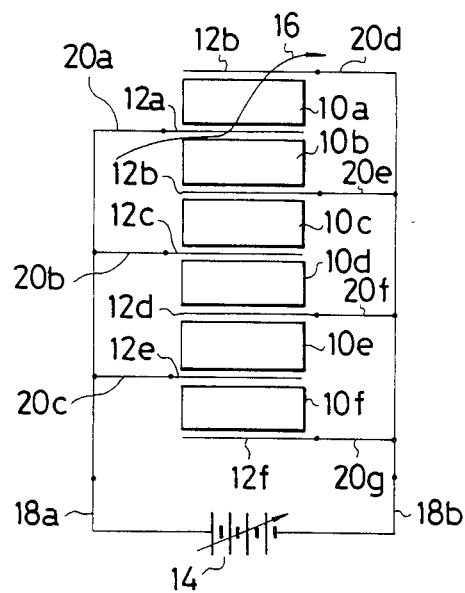
FIG. 2 is the circuit block diagram of the prior art device shown by FIG. 1.

To facilitate the understanding of the present invention, a brief reference will be made to a prior art stacked type piezo-electric element device illustrated in FIGS. 1 and 2.

As shown, a prior art stacked type piezo-electric element device of parallel type bimorph is constructed by stacking a plurality of piezo-electric elements 10a, 10b, 10c, . . . by sandwiching them with the electrodes 12a, 12b, 12c, . . . , and by connecting each of the electrodes 12a, 12b, 12c, . . . in parallel to a power source 14. In the above stacked type piezo-electric element device, in order to obtain a large displacement, the thickness of each of the piezo-electric elements 10a, 10b, 10c, . . . is ordinarily arranged to have as small a value as is possible, with 10 to 20 of the elements stacked in the practical case, though the case of six elements is illustrated in the figures. In addition, due to the fact that the displacements of the piezo-electric elements 10a, 10b, 10c, . . . are proportional to the intensity of the electric field, the device is frequently used with a relatively high voltage being applied to the piezo-electric elements. However, this means that a dielectric breakdown of the piezo-electric elements themselves or a discharge between the electrodes of the piezo-electric elements will easily to take place.

In such a stacked type piezo-electric element device, when, for example, there occurs a dielectric breakdown in the portion represented by the piezo-electric element 10a, the short-circuit current 16 flows through a power circuit 18a which is connected to the power source 14, a voltage impression circuit 20a which is connected to the power circuit 18a, the electrode 12a of the piezo-electric element 10a which is connected to the voltage impression circuit 20a, and further, from the electrode 12a, via the piezo-electric element 10a, through an electrode 12b, a voltage impression circuit 20d, to a power circuit 18b. Therefore the power source 14 will fail to supply a prescribed output voltage, and hence, the displacing function in all of the stacked piezo-electric elements will be lost. That is, there was a problem that the entire function as an actuator of the stacked type elements is lost even when only a portion of the stacked elements is short circuited due to dielectric breakdown or the like.

The present invention is aimed at solving a problem like the one mentioned above and is described in reference to FIGS. 3 to 8.

Figure 3:
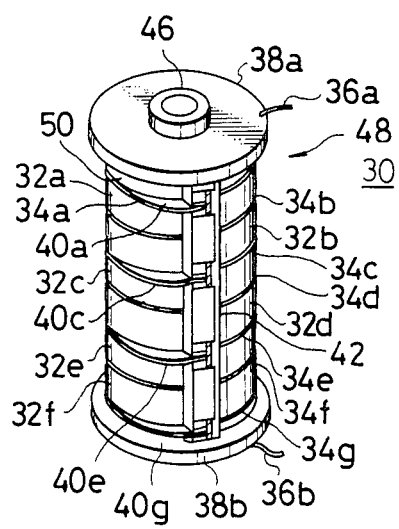
FIG. 3 is an overall perspective view of a stacked type piezo-electric element device embodiying the present invention
Figure 5:
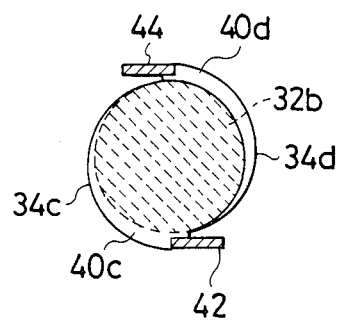
FIG. 5 is a cross-sectional view of the electrode section of the device shown in FIG. 3.

As shown in FIG. 3, a stacked type piezo-electric element device embodying the present invention is shown with a reference numeral 30. The stacked type piezo-electric element device 30 is constructed by stacking a plurality of piezo-electric elements 32a–32f by sandwiching them with electrodes 34a–34g, fixing the entire structure into the form of a tower by means of an adhesive, installing power source terminals 38a and 38b that constitute the power circuits 36a and 36b, on respective ends of the tower structure, and arranging printed boards 42 and 44 (the printed board 44 being arranged on the other side as shown in FIG. 5) at the ear sections 40a–40g that are formed on the electrodes 34a–34g. Here, the protrusion 46 at the centers of the power source terminals 38a and 38b is a mounting screw section for mounting the piezo-electric structure 48 to another part, and there is arranged an insulation board 50 inserted between the back side of the power source terminal 38a and the electrode 34a.

Figure 6:
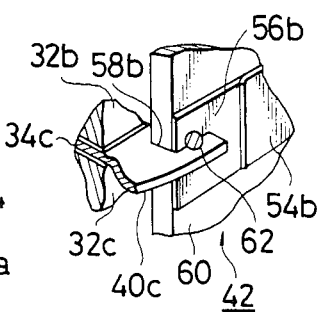
FIG. 6 is a partial cross-sectional perspective view of the coupling section between the printed board and electrodes of the device shown in FIG. 3.

As shown by FIGS. 4 to 6, on the printed board 42 there are arranged, in patterned fashion, a conducting section 52b that constitutes the power source circuit, polysilicon films 54a–54d, and the conducting sections 56a–56d that constitute the voltage impression circuits, on a piece of glass 60 that has indentations 58a–58d to be coupled with the ear sections 40a, 40c, 40e, and 40g of the electrodes 34a, 34c, 34e, and 34g, respectively. The polysilicon films 54a–54d are constructed in such a way as to interrupt the circuit current when, for example, an excessive current flows in the piezo-electric element 32a. Namely, the excessive current flows in the circuit formed by the power circuit 52a →voltage impression circuit 56e →piezo-electric element 32a →voltage impression circuit 56a →circuit breaker 54a →power circuit 52b →power source, so that the polysilicon film melts down to interrupt the current in this circuit. Although the circuit breaker in the present embodiment is constructed using an evaporated film of polysilicon, any other kind of melt-down type fuse will do. Thus, for example, it may be a lead fuse. Furthermore, it may be a type in which the interrupting function is incorporated in the piezo-electric element itself, without preparing a circuit breaker in the outside of the piezo-electric element.

The electrodes 34a–34g are conducting sections having respective ear sections 40a–40g, where the ear sections are arranged to appear on every other in order to avoid their overlapping. For example, the ear section 40c of the electrode 34c is constructed so as to have the ear section 40d located on the other side of 40c. On the ear section 40d which is on the other side, there is installed a printed board 44 on which are prepared a power circuit and a voltage impression circuit that apply a voltage on the electrode 34d. The printed board 44 is made similar to the printed board 42 which is installed at the opposing position, but is constructed without the polysilicon films.

Figure 4A:
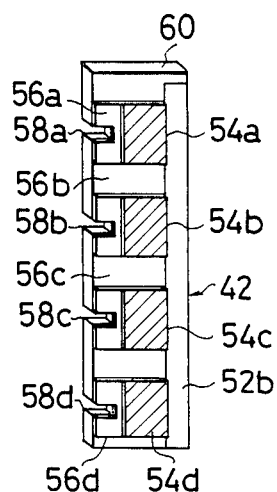
FIGS. 4a and 4b are perspective views of the printed board of the device shown in FIG. 3.
Figure 4B:
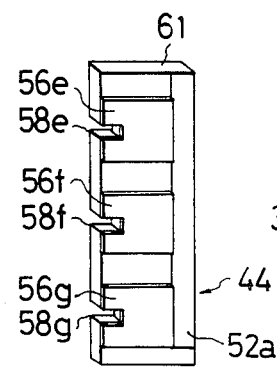

The coupling sections of the printed board 42 (similarly for the printed board 44) and the ear sections 40a, 40c, 40e, and 40g of the electrodes 34a, 34c, 34e, and 34g, respectively, are soldered 62 at the indentations 58a–58d, as shown by FIGS. 4a and 4b, to be connected electrically.

Next, the operation of the stacked type piezo-electric element device constructed in this way will be described by referring to FIG. 7.

Figure 7:
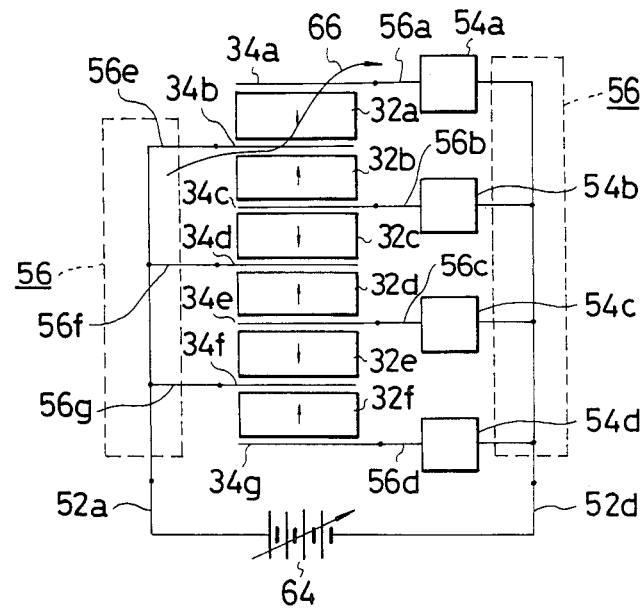
FIG. 7 is a circuit diagram of the device shown in FIG. 3.

FIG. 7 illustrates the circuit diagram of an example of the stacked type piezo-electric element device which employs the parallel type bimorph. As shown, the electrodes 34a–34g, that are arranged so as to face each end surface of the piezo-electric elements 32a–32f of the parallel type bimorphs, are connected respectively to the voltage impression circuits 56a–56g of a voltage impression section 56, and on the side of the voltage impression circuits 56a–56d there are inserted circuit breakers 54a–54d between these circuits and the power circuit 52b. On the other hand, on the side of the voltage impression circuits 56e–56g, these circuits are connected directly to the power circuit 52a. That is, the electrical to mechanical conversion of energy by the piezo-electric elements is being accomplished by aplying the voltage from the power source 64 to the electrode surfaces of the piezo-electric elements 32a–32f.

Suppose now that one of the piezo-electric elements, 32a, suffers a dielectric breakdown for some reason. Then, the power source 64 will be short circuit, with an abnormal current 66 flowing in the voltage impression circuits 56a and 56e. When this abnormal current exceeds a predetermined value, that is, when it is sufficiently strong to break the circuit breaker 54a, the voltage impression circuits 56a and 56e will be interrupted immediately by the melting of the circuit breaker 54a. In other words, there will be given no excessive load to the power source 64 by the interruption of the circuit breaker 54a, protecting the output mechanism of the power source. Not only that, even when the piezo-electric element 32a becomes inoperative, a steady-state voltage will be maintained on the remaining piezo-electric elements 32b–32f so that other stacked type elements will continue to maintain the function as an actuator, without ceasing the overall function of the device.

Figure 8:
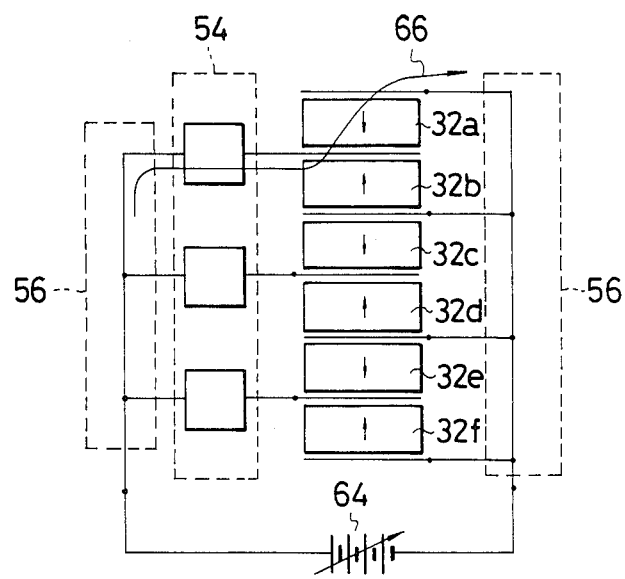
FIG. 8 is a circuit diagram for another embodiment of the stacked type piezo-electric element device in accordance with the present invention.

It should be noted in a circuit construction as shown by FIG. 7 that an arrangement is made to interrupt the failed element alone by installing the circuit breakers 54 on the side where there are a larger number of voltage impression circuits 56. However, as shown by FIG. 8, it is possible to decrease the number of required circuit breakers 54 and make the construction simpler by installing the circuit breakers 54 on the side where there are smaller number of voltage impression circuits 56. In either case, it is possible to maintain the function of the device as an actuator.

Various modifications will become possible for those skilled in the art in view of the teachings of the present disclosure without departing from the scope thereof.

What is claimed is:

1. A stacked type piezo-electric device for converting electrical energy into mechanical energy comprising:
    a plurality of stacked piezo-electric elements, each piezo-electric element having electrodes on both sides thereof;
    a power circuit;
    a plurality of voltage impression circuit means corresponding to each of said piezo-electric elements, for applying a voltage to each of the electrodes of said piezo-electric elements, said plurality of voltage impression circuit means connected in parallel with one another to said power circuit thereby establishing for each piezo-electric element a current path from said power circuit and through said corresponding voltage impression circuit means for causing said conversion of electrical to mechanical energy;
    a plurality of circuit breaking means, one of which is connected in the current path of each piezo-electric element for interrupting the current that flows in said current path only when said current exceeds a predetermined value, whereby remaining current, not exceeding said predetermined value, continues to flow in said remaining current paths.

2. A stacked type piezo-electric element device as claimed in claim 1, in which each of said circuit breaker means comprises a thin film of meltable fuse.

3. A stacked type piezo-electric element device as claimed in claim 2, in which said meltable fuse is made of polysilicon.

4. A stacked type piezo-electric element device as claimed in claim 3, in which said power circuit, said voltage impression circuit means, and said circuit breaking means comprise a pattern which includes an insulation board arranged along the direction of stacking of the piezo-electric elements, a power circuit section containing said power section and installed on the surface of the insulation boards, fuse sections containing said circuit breaking means connected to the power source section and arranged corresponding to said piezo-electric elements, and said voltage impression circuit means connected to the fuse section and the piezo-electric elements.

5. A stacked type piezo-electric element device as claimed in claim 4, in which said insulation board is made from a glass board.

* * * * *